US010659005B2

(12) United States Patent
Kuwahara et al.

(10) Patent No.: US 10,659,005 B2
(45) Date of Patent: *May 19, 2020

(54) AT-CUT CRYSTAL ELEMENT, CRYSTAL RESONATOR AND CRYSTAL UNIT

(71) Applicant: NIHON DEMPA KOGYO CO., LTD., Tokyo (JP)

(72) Inventors: Takayuki Kuwahara, Saitama (JP); Kenji Shimao, Saitama (JP); Hirokazu Iwata, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 651 days.

This patent is subject to a terminal disclaimer.

(21) Appl. No.: 15/086,064

(22) Filed: Mar. 31, 2016

(65) Prior Publication Data

US 2016/0294356 A1    Oct. 6, 2016

(30) Foreign Application Priority Data

Apr. 2, 2015    (JP) .................................. 2015-075927

(51) Int. Cl.
*H03H 9/19*    (2006.01)
*H03H 3/02*    (2006.01)
*H03H 9/02*    (2006.01)

(52) U.S. Cl.
CPC ............... *H03H 9/19* (2013.01); *H03H 3/02* (2013.01); *H03H 9/02023* (2013.01); *H03H 9/02133* (2013.01); *H03H 2003/022* (2013.01)

(58) Field of Classification Search
CPC .................................. H03H 9/19; H03H 3/02
See application file for complete search history.

(56) References Cited

U.S. PATENT DOCUMENTS

| 7,608,987 | B2* | 10/2009 | Naito | ........................ | H03H 3/04 |
| | | | | | 310/361 |
| 10,263,597 | B2* | 4/2019 | Sato | ........................ | H03H 3/02 |
| 2011/0068660 | A1* | 3/2011 | Naito | ........................ | H03H 3/04 |
| | | | | | 310/367 |
| 2015/0229291 | A1* | 8/2015 | Lim | ........................ | H03H 9/19 |
| | | | | | 310/321 |

FOREIGN PATENT DOCUMENTS

| JP | S54153593 | 12/1979 |
| JP | 2001285000 | 10/2001 |
| JP | 2002271167 | 9/2002 |
| JP | 2008067345 | 3/2008 |
| JP | 2008098712 | 4/2008 |
| JP | 2011193175 | 9/2011 |
| JP | 2014027505 | 2/2014 |
| JP | 2014027506 | 2/2014 |
| JP | 2016034107 | 3/2016 |

OTHER PUBLICATIONS

"Office Action of Japanese Counterpart Application," dated Apr. 24, 2018, pp. 1-7.

* cited by examiner

*Primary Examiner* — Thomas M Dougherty
*Assistant Examiner* — Karen B Addison
(74) *Attorney, Agent, or Firm* — JCIPRNET

(57) ABSTRACT

An AT-cut crystal element is provided. The AT-cut crystal element includes side surfaces intersecting with a Z'-axis of a crystallographic axis of a crystal. At least one side surface of the side surfaces is constituted of three surfaces of a first surface to a third surface. Besides, a crystal resonator including the AT-cut crystal element, and a crystal unit including the crystal resonator are provided.

7 Claims, 18 Drawing Sheets

AT-CUT CRYSTAL ELEMENT, CRYSTAL RESONATOR AND CRYSTAL UNIT

CROSS REFERENCE TO RELATED APPLICATIONS

This application is based on and claims priority under 35 U.S.C. § 119 to Japanese Patent Application No. 2015-075927, filed on Apr. 2, 2015, the entire content of which is incorporated herein by reference.

TECHNICAL FIELD

This disclosure relates to an AT-cut crystal element and a crystal resonator using the same.

DESCRIPTION OF THE RELATED ART

As downsizing of an AT-cut crystal resonator proceeds, it has become difficult to fabricate crystal elements for crystal resonators by a fabrication method of mechanical processing. Then, an AT-cut crystal element fabricated using photolithography technique and wet etching technique has been developed.

A known AT-cut crystal element and crystal resonator fabricated by the above-described techniques is disclosed in, for example, Japanese Unexamined Patent Application Publication No. 2014-27505 and Japanese Unexamined Patent Application Publication No. 2014-27506. Specifically, Japanese Unexamined Patent Application Publication No. 2014-27505 discloses an AT-cut crystal element in which a side surface intersecting with an X-axis of crystal (X-surface) is constituted of at least four surfaces, and a crystal resonator that employs the AT-cut crystal element. Japanese Unexamined Patent Application Publication No. 2014-27506 discloses an AT-cut crystal element in which a side surface intersecting with a Z'-axis of the crystal (Z'-surface) is constituted of at least four surfaces, and a crystal resonator that employs the AT-cut crystal element.

In each case, an etching resist mask for forming an outer shape is formed on a quartz substrate, and a part on the quartz substrate without being covered with the mask is dissolved by the wet etching to form an approximate outer shape of the crystal element. Next, after the mask is removed from the quartz substrate, the wet etching is performed to the quartz substrate such that the corresponding side surface (above-described X-surface and Z'-surface) includes at least four surfaces. The crystal element formed in such process is reduced vibration leakage to achieve an AT-cut crystal resonator with excellent property.

However, the inventor of the present application earnestly studied to find that the AT-cut crystal resonator still had room for improving the property. A need thus exists for an AT-cut crystal element and a crystal resonator which are not susceptible to the drawback mentioned above.

SUMMARY

An AT-cut crystal element according to an aspect of the disclosure includes: side surfaces (that is, Z' surfaces) that intersect with a Z'-axis of a crystallographic axis of a crystal, and at least one side surface of the side surfaces is constituted of three surfaces of a first surface to a third surface.

With the AT-cut crystal element according to the embodiment, the AT-cut crystal element includes a Z' side surface that is constituted of predetermined three surfaces. This achieves a crystal element that has a unique beak-shaped structure in a cross-sectional view on the end portion of the crystal element in a Z' direction. The above-described unique structure attenuates unnecessary vibrations other than vibrations original to the AT-cut to dominantly generate the vibration original to the AT-cut crystal resonator. Therefore, the AT-cut crystal resonator with the improved property compared with conventional AT-cut crystal resonators is achieved.

BRIEF DESCRIPTION OF THE DRAWINGS

The foregoing and additional features and characteristics of this disclosure will become more apparent from the following detailed description considered with reference to the accompanying drawings, wherein.

DETAILED DESCRIPTION

Figure 1A:
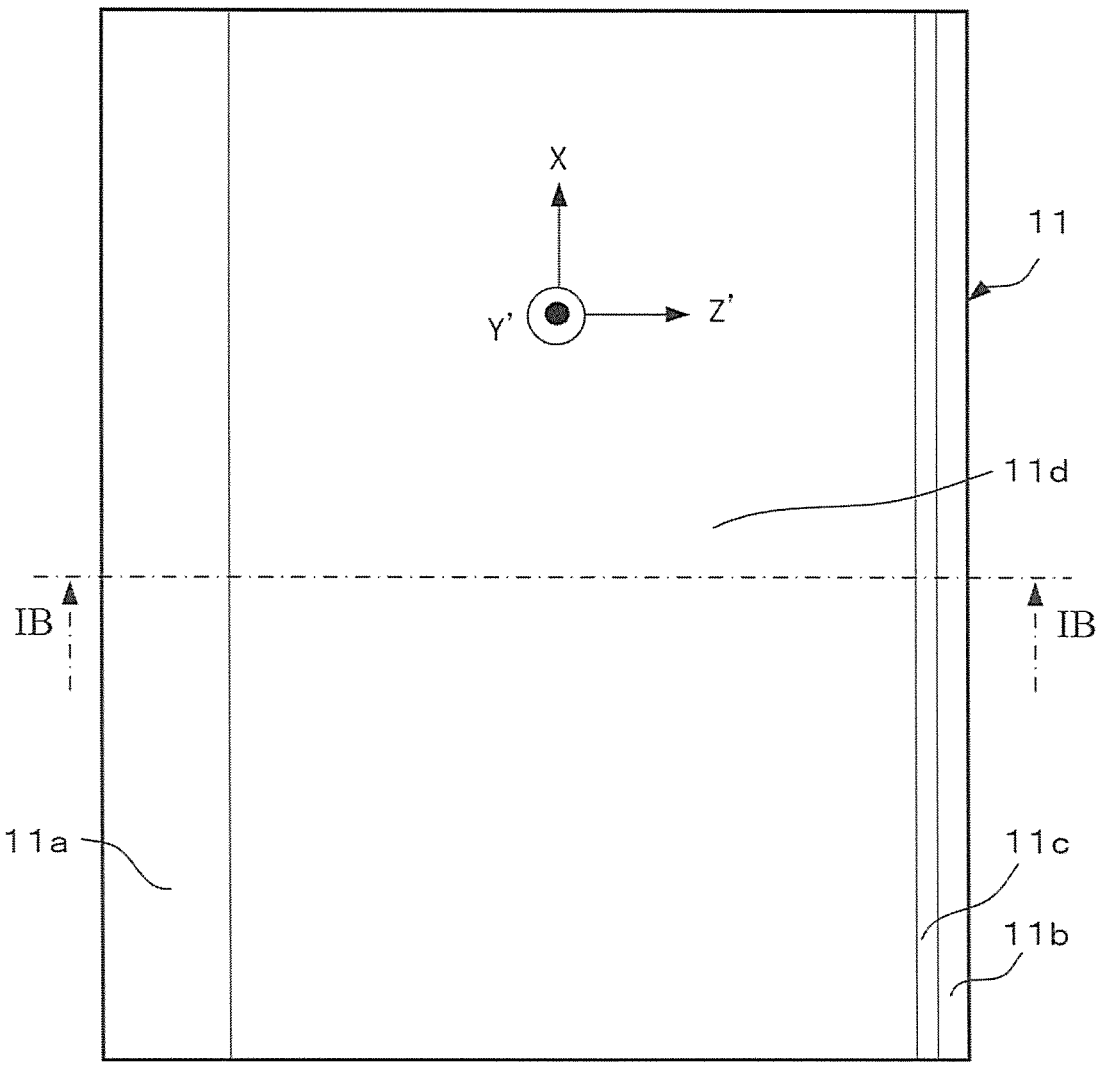
FIG. 1A, FIG. 1B, and FIG. 1C are explanatory drawings illustrating an AT-cut crystal element 11 according to the embodiment.

The following describes the embodiments of an AT-cut crystal element and a crystal resonator that employs the AT-cut crystal element according to this disclosure with reference to drawings. Each drawing used in descriptions are merely illustrated schematically for understanding the embodiments. In each drawing used in descriptions, like reference numerals designate corresponding or identical elements, and therefore such elements will not be further elaborated here. Shapes, dimensions, material, and similar factor described in the following explanations are merely preferable examples within the embodiments. Therefore, the disclosure is not limited to only the following embodiments.

[1. Structure of AT-Cut Crystal Element]

Figure 1B:
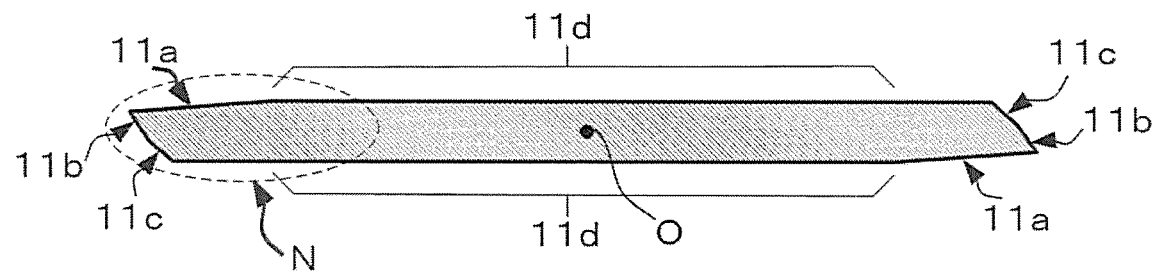
Figure 1C:
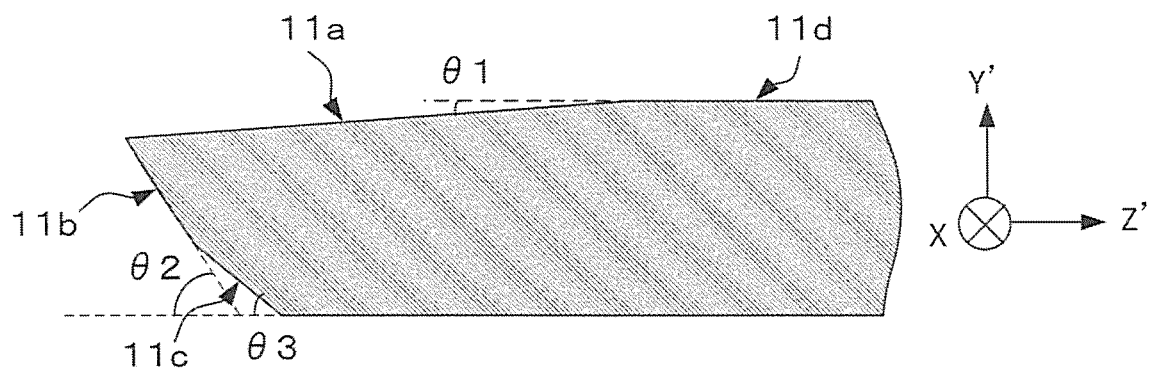

FIG. 1A to FIG. 1C are explanatory drawings illustrating an AT-cut crystal element 11 according to the embodiment.

Especially, FIG. 1A is a plan view of the crystal element 11, FIG. 1B is a sectional drawing of the crystal element 11 taken along a line IB-IB in FIG. 1A, and FIG. 1C is an enlarged sectional drawing illustrating a part N in FIG. 1B.

Here, coordinate axes X, Y', and Z' illustrated in FIG. 1A and FIG. 1C are crystallographic axes of crystal in the AT-cut crystal element. The AT-cut crystal element is described in, for example, "Handbook of Quartz Crystal Device" (Fourth Edition, page 7 or other pages, published by Quartz Crystal Industry Association of Japan, March 2002) in detail. Therefore, the explanation will be omitted.

The AT-cut crystal element 11 according to the embodiment has a property in a shape of a side surface (Z'-surface) intersecting with the Z'-axis of the crystal. That is, especially illustrated in FIG. 1B and FIG. 1C, the AT-cut crystal element 11 has two side surfaces (Z'-surfaces) intersecting with the Z'-axis of the crystal, and each Z'-surface is configured of three surfaces of a first surface 11a, a second surface 11b, and a third surface 11c. Moreover, the first surface 11a is a surface that intersects with a principal surface 11d of the crystal element 11, and a surface corresponding to a surface where the principal surface 11d is rotated around the X-axis of the crystal by θ1.

Furthermore, in the crystal element 11, the first surface 11a, the second surface 11b, and the third surface 11c intersect in this order. Moreover, the second surface 11b is a surface corresponding to a surface where the principal surface 11d is rotated around the X-axis of the crystal by θ2, and the third surface 11c is a surface corresponding to a surface where the principal surface 11d is rotated around the X-axis of the crystal by θ3. These angles θ1, θ2, and θ3 preferably have the values below, while the details will be described later in "3. Experimental Result." θ1=4°±3.5°, θ2=−57°±5°, θ3=42°±5°, more preferably, θ1=4°±3°, θ2=−57°±3°, θ3=−42°±3°

The crystal element 11 according to the embodiment is configured such that the two side surfaces (Z'-surfaces) intersecting with the Z'-axis of the crystal are disposed in a point symmetry with a center point O of the crystal element 11 (see FIG. 1B) as a center. Here, the point symmetry includes a state of the point symmetry that can be regarded as a substantially identical shape even if there is a slight difference in the shape. The crystal element 11 according to the embodiment is configured to have a planar shape in a rectangular shape where a direction along the X-axis of the crystal is a long side, and a direction along the Z'-axis of the crystal is a short side.

[2. Exemplary Manufacturing Method for AT-Cut Crystal Element 11]

Figure 5A:
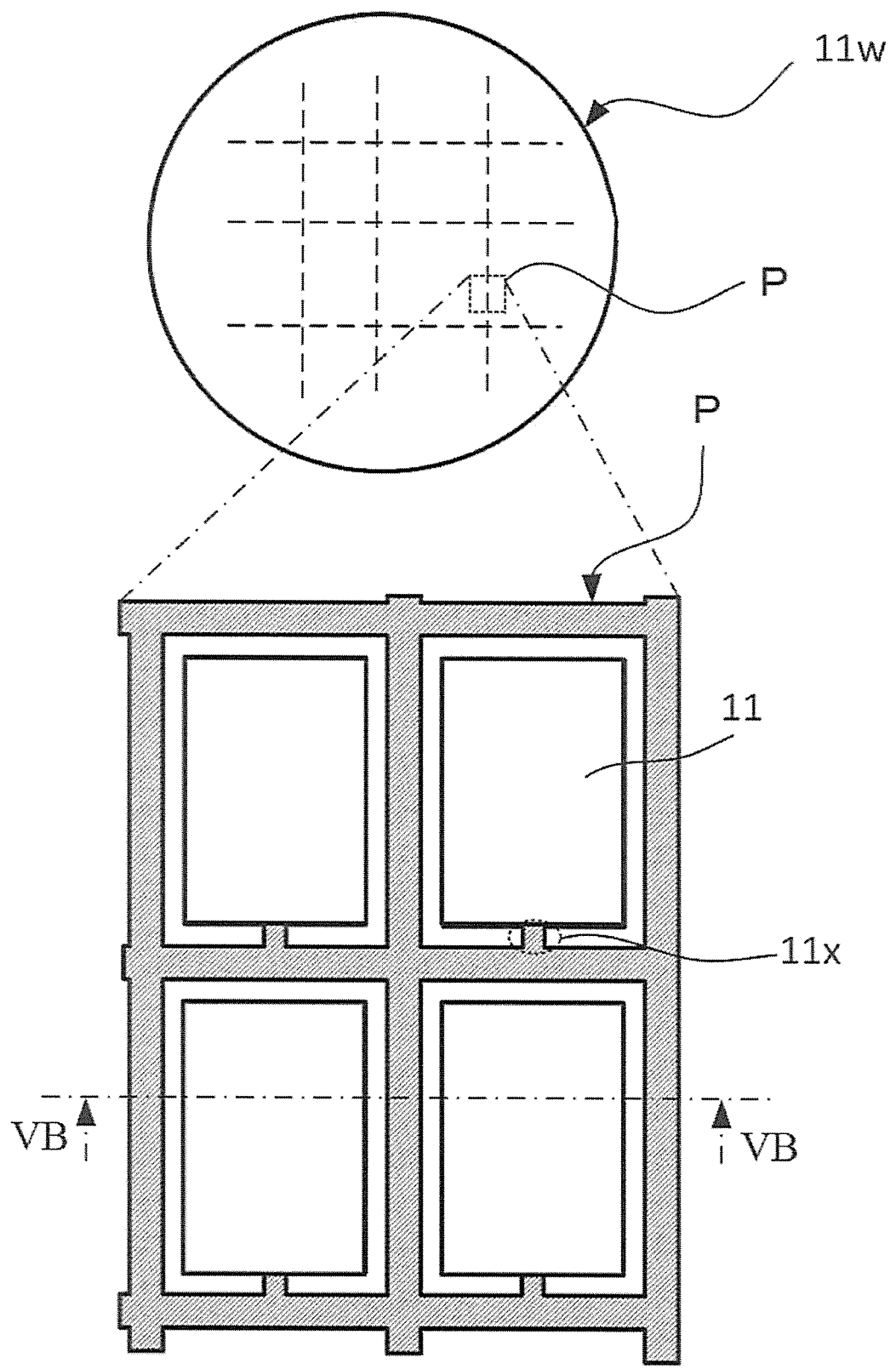
FIG. 5A, FIG. 5B, and FIG. 5C are explanatory drawings illustrating the exemplary manufacturing method following FIG. 4A and FIG. 4B.
Figure 5B:
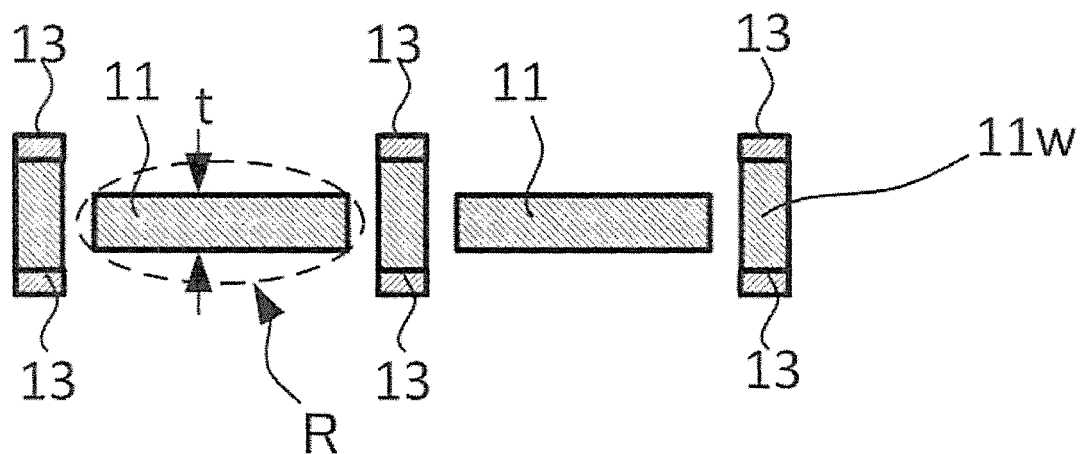

Next, a description will be given of an exemplary manufacturing method for the AT-cut crystal element 11 according to the embodiment with reference to FIG. 2A and FIG. 2B to, FIG. 8A to FIG. 8E. A large number of the crystal element 11 can be manufactured from a quartz-crystal wafer by photolithography technique and wet etching technique. Accordingly, FIG. 2A and FIG. 2B to, FIG. 8A to FIG. 8E include plan views of a quartz-crystal wafer 11w and enlarged plan views of a part P of the quartz-crystal wafer 11w. Further, some drawings among FIG. 2A and FIG. 2B to, FIG. 8A to FIG. 8E also include sectional drawings taken along a line IIB-IIB, a line IIIB-IIIB, a line IVB-IVB, a line VB-VB, and a line VIIB-VIIB of the part P of the quartz-crystal wafer 11w, and enlarged figures of a part R (see FIG. 5B).

Figure 2A:
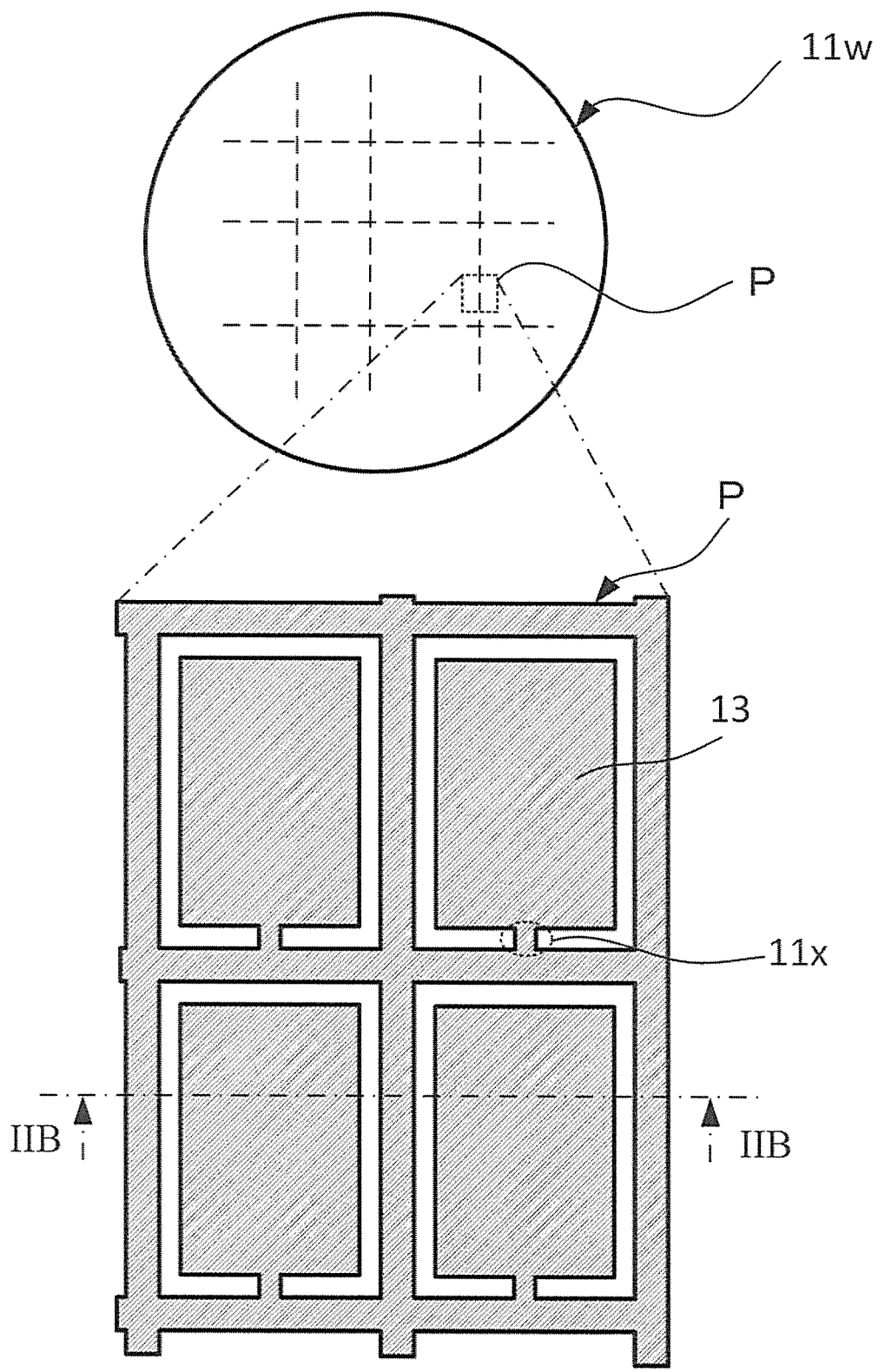
FIG. 2A and FIG. 2B are drawings illustrating an exemplary manufacturing method for a crystal element 11 and a crystal resonator that employs the crystal element 11 according to the embodiment.
Figure 2B:
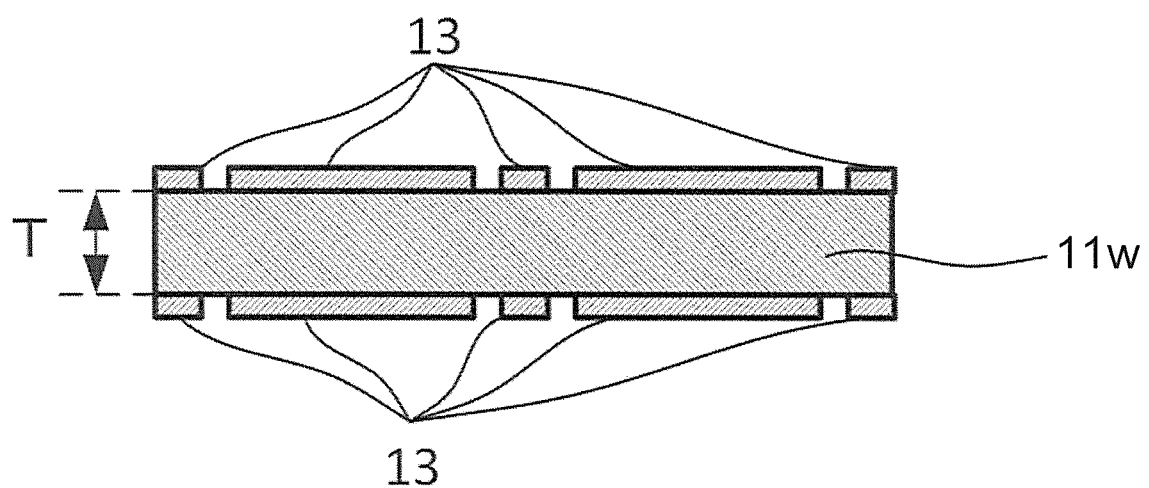

In the exemplary manufacturing method, firstly, the quartz-crystal wafer 11w is prepared (see FIG. 2A and FIG. 2B). While, as it is well known, the oscillation frequency of the AT-cut crystal element 11 is approximately determined by the thickness of the principal surface (X-Z' surface) of the crystal element 11, the quartz-crystal wafer 11w is a wafer with a thickness T (see FIG. 2B) that is thicker than a final thickness t (see FIG. 5B) of the crystal element 11.

Next, the well-known photolithography technique is used to form etching resist masks 13, which is a mask to form the outer shape of the crystal element, on both front and back surfaces of the quartz-crystal wafer 11w. The etching resist masks 13 according to the embodiment are configured of a part corresponding to the outer shape of the crystal element, a frame part that holds each crystal element, and a part that connects the crystal element and the frame part (a part indicated as "11x" in FIG. 2A). The etching resist masks 13 are formed to oppose one another on the front and back of the quartz-crystal wafer 11w.

Figure 3A:
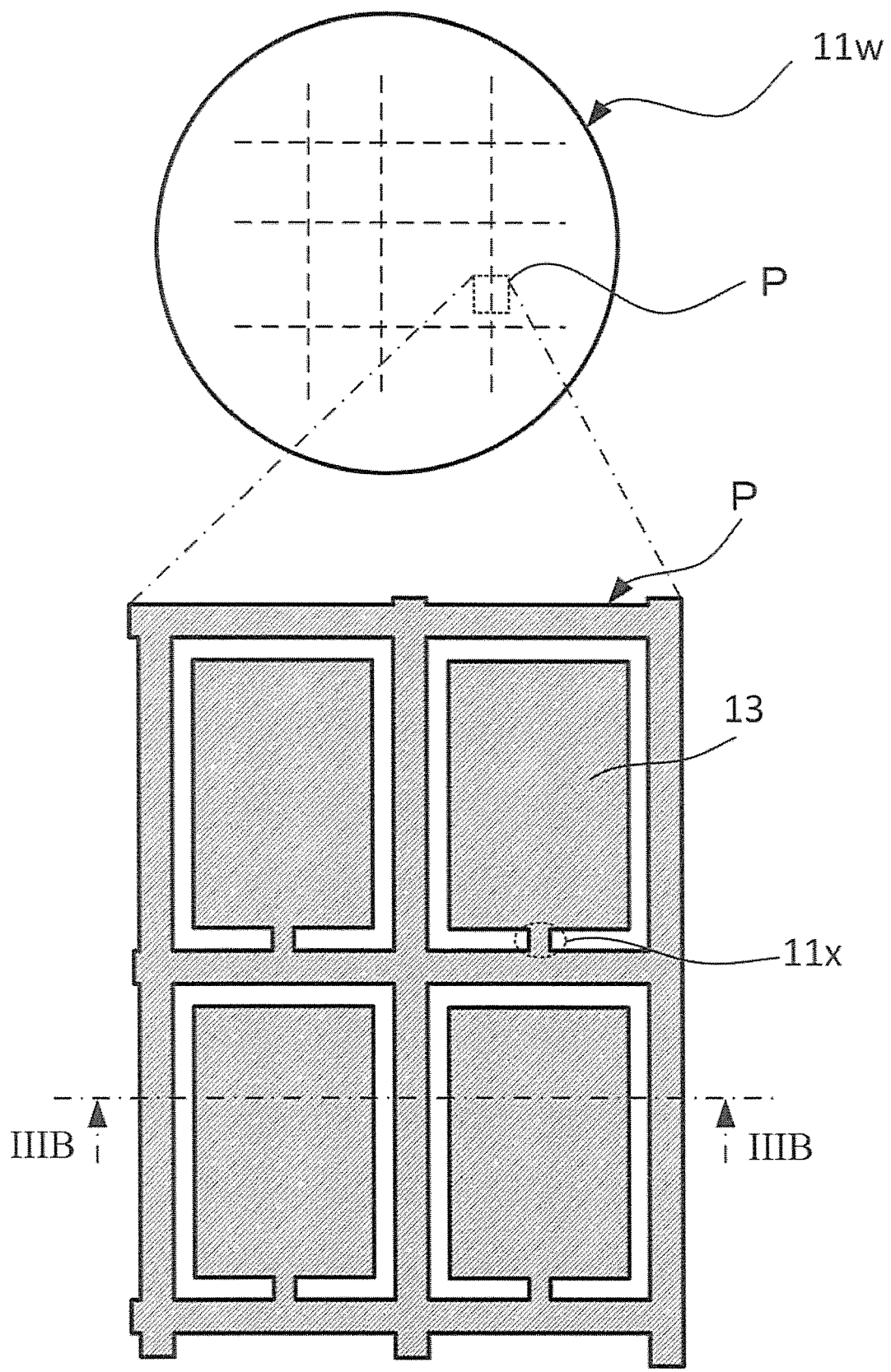
FIG. 3A and FIG. 3B are explanatory drawings illustrating the exemplary manufacturing method following FIG. 2A and FIG. 2B.
Figure 3B:
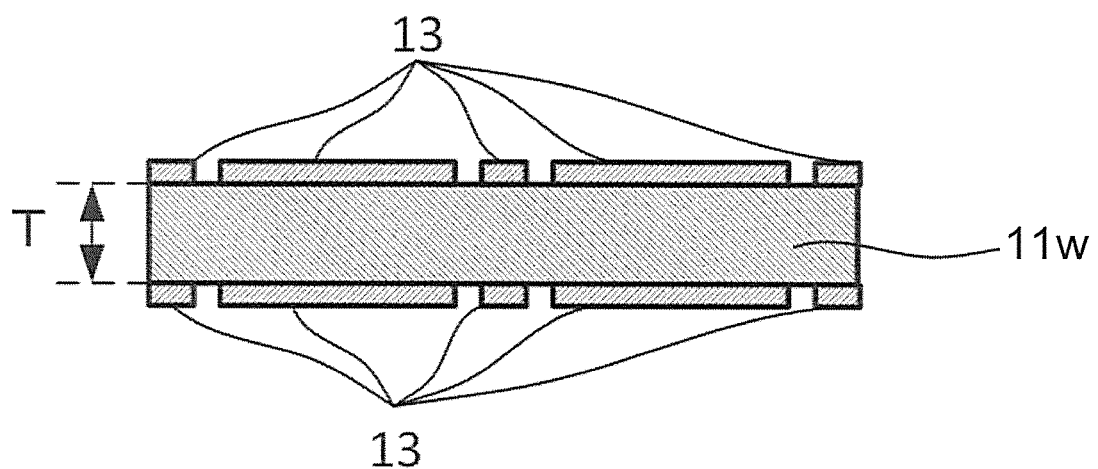

The quartz-crystal wafer 11w after forming of the etching resist masks 13 is dipped in an etching solution mainly composed of hydrogen fluoride for a predetermined period. This process dissolves parts of the quartz-crystal wafer 11w without being covered with the etching resist masks 13 to provide the approximate outer shape of the crystal element 11 (see FIG. 3A and FIG. 3B).

Figure 4A:
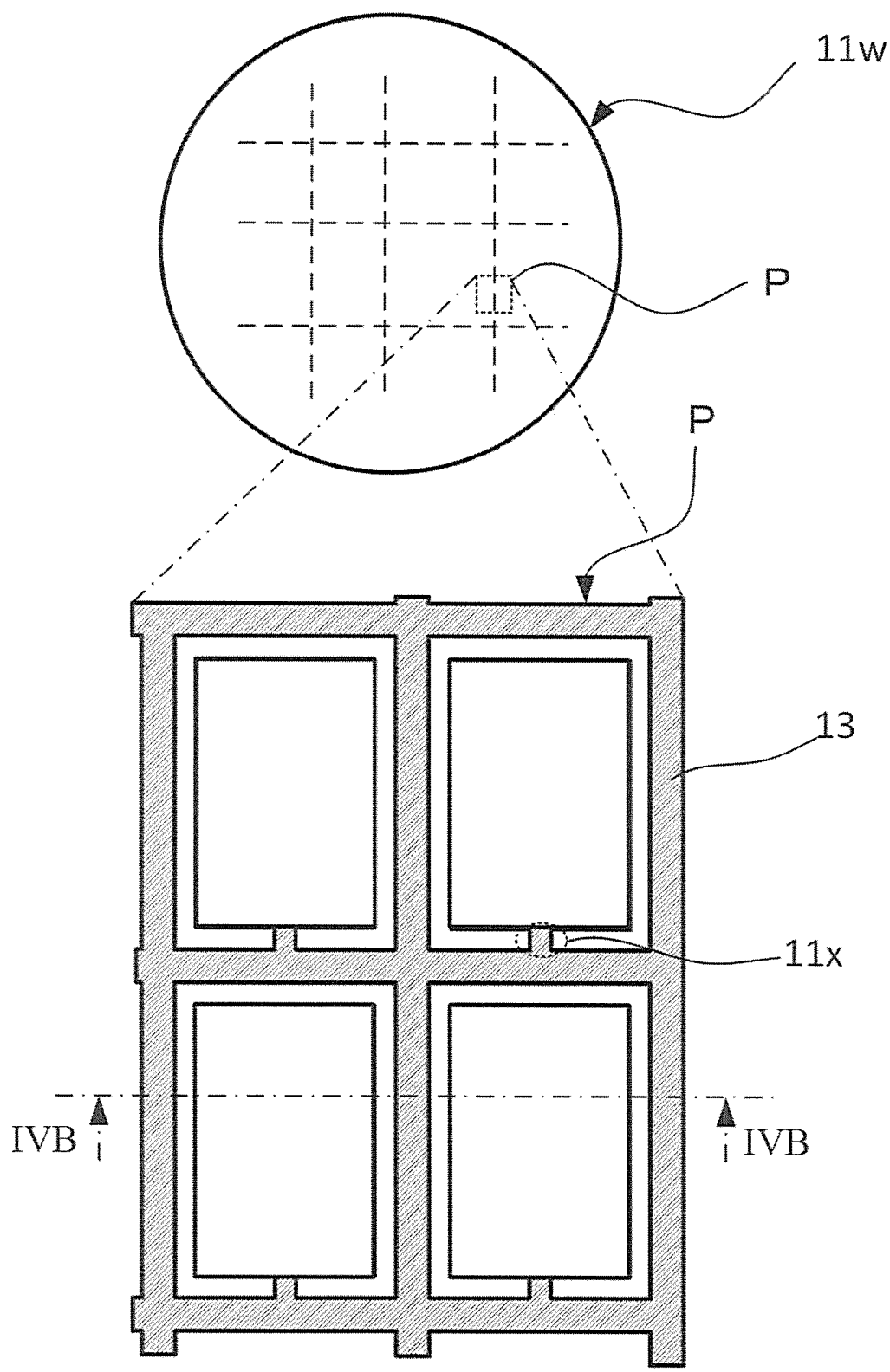
FIG. 4A and FIG. 4B are explanatory drawings illustrating the exemplary manufacturing method following FIG. 3A and FIG. 3B.
Figure 4B:
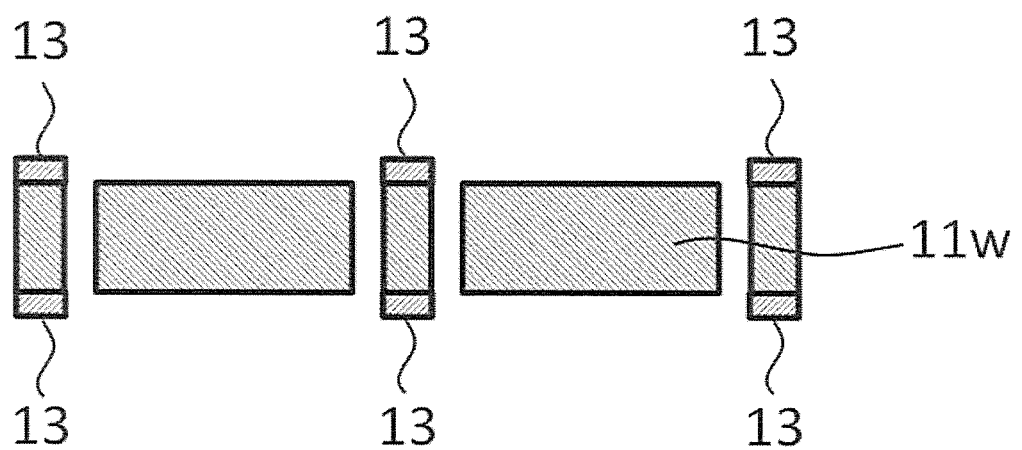

Next, the etching resist masks 13 are removed from the quartz-crystal wafer 11w. In this process, the exemplary manufacturing method removes only the part corresponding to the crystal element 11 of the etching resist masks 13, and leaves the part corresponding to a frame portion and a connecting portion (see FIG. 4A and FIG. 4B). This is performed to maintain the strength of the frame portion and the connecting portion. It is needless to say that the etching resist mask 13 covering the entire or a part of the frame portion and the connecting portion may be removed depending on the design.

Figure 9:
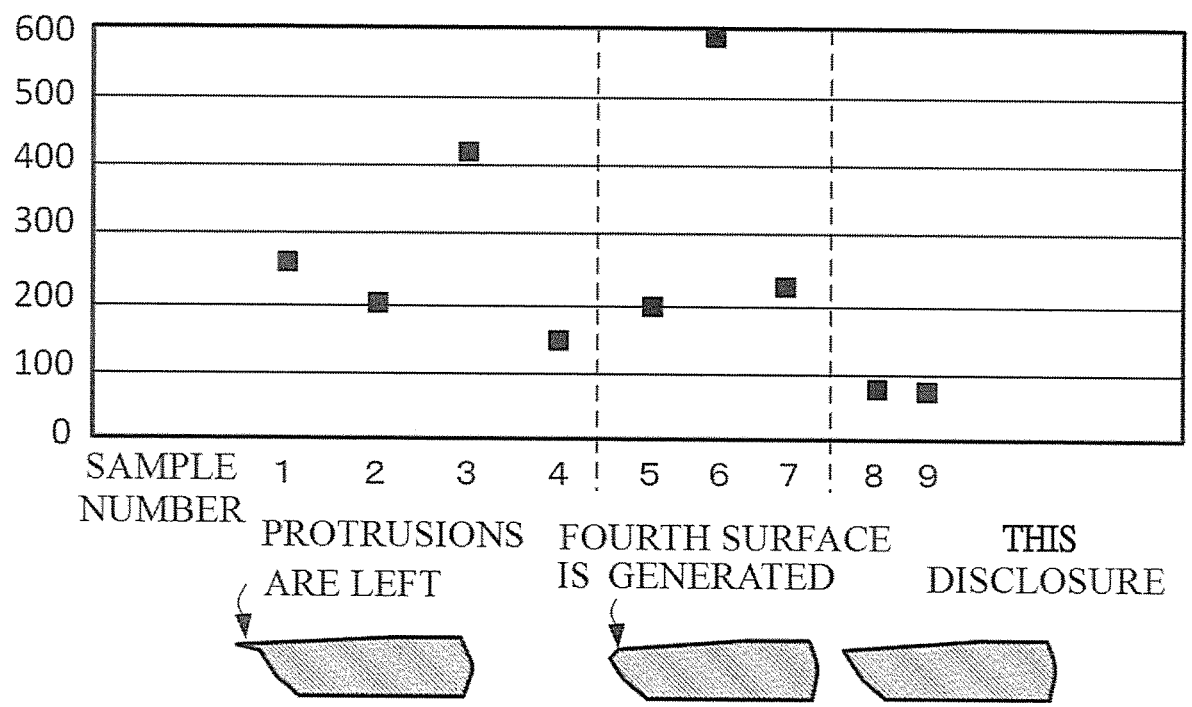
FIG. 9 is an explanatory drawing illustrating an experimental result according to this disclosure.

Next, the quartz-crystal wafer 11w is dipped again in the etching solution mainly composed of hydrogen fluoride for the predetermined period. Here, the predetermined period is a period where the thickness t (see FIG. 5B) of a forming scheduled region for the crystal element 11 can satisfy the specification of an oscillation frequency required to the crystal element 11, and the Z' side surface of the crystal element 11 can be constituted of the first surface 11a to the third surface 11c according to the embodiment. These periods can be determined by experiments in advance. The experiments performed by the inventor have found that, as the etching proceeds, as illustrated in FIG. 9, the Z'-surface of the crystal element 11 varies in a state where protrusions are left, a state where the Z'-surface is constituted of four surfaces of the first to a fourth surface (the fourth surface generating state), and a state where the Z'-surface is constituted of three surfaces of the first to the third surface according to the embodiment (the state of this disclosure) in this order. Moreover, the experiments have found that, to obtain the side surface constituted of the three surfaces of the first to the third surface according to the embodiment, in the case where the etching is performed in the predetermined etchant, the etching temperature, and similar condition, it is necessary for the quartz-crystal wafer 11w to be performed the etching until the quartz-crystal wafer 11w has the thickness with a range of 55% to 25% with respect to an initial thickness T. Therefore, the initial thickness T, the above-described etching period, and similar factor are determined such that the specification of the oscillation frequency and the three surfaces of the first to the third surface are obtained.

Figure 6:
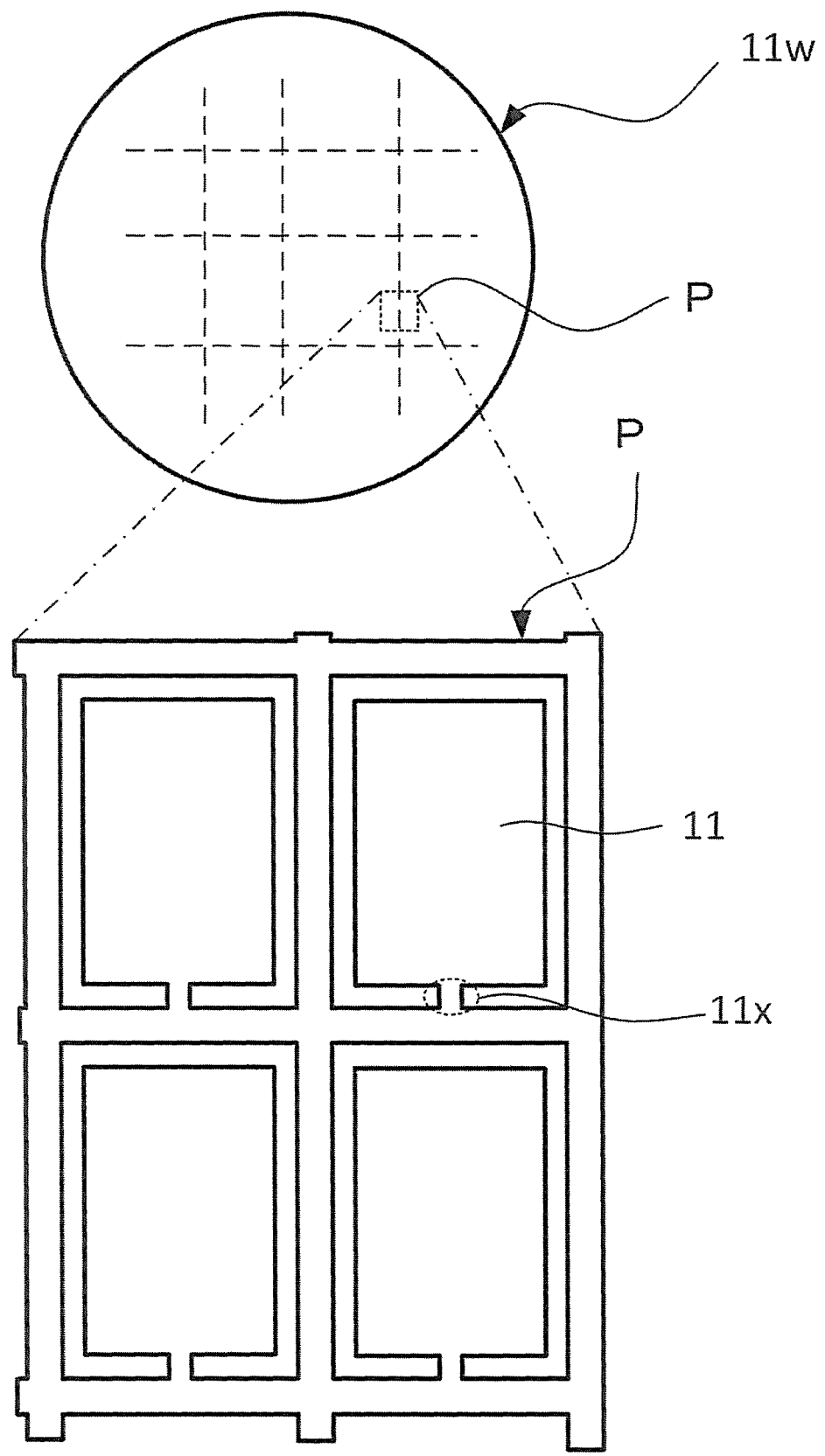
FIG. 6 is an explanatory drawing illustrating the exemplary manufacturing method following FIG. 5A, FIG. 5B, and FIG. 5C.

Next, after the above-described etching, the etching resist masks 13 are removed from the quartz-crystal wafer 11w so as to expose a crystal surface (see FIG. 6). Then, a well-known film formation method is used to form a metal film (not illustrated) for forming excitation electrodes and extraction electrodes of the crystal resonator on the entire surface of the quartz-crystal wafer 11w. Next, the well-known photolithography technique and metal etching technique are used to perform a patterning on the metal film in an electrode shape to form an electrode pattern 15 which includes an excitation electrode 15a and an extraction electrode 15b (see FIG. 7A to FIG. 7C). This provides a crystal resonator 17 that includes the crystal element 11, the excitation electrode 15a and the extraction electrode 15b (see FIG. 7A to FIG. 7C).

Generally, a structure in which the crystal resonator 17 is mounted in a preferred container is often referred to as a crystal unit. The following describes the typical example with reference to FIG. 8A to FIG. 8E. FIG. 8A to FIG. 8E are plan views and sectional drawings taken along a line VIIIC-VIIIC and a line VIIIE-VIIIE illustrating a procedure to mount the crystal resonator 17 in a container 21.

Figure 7A:
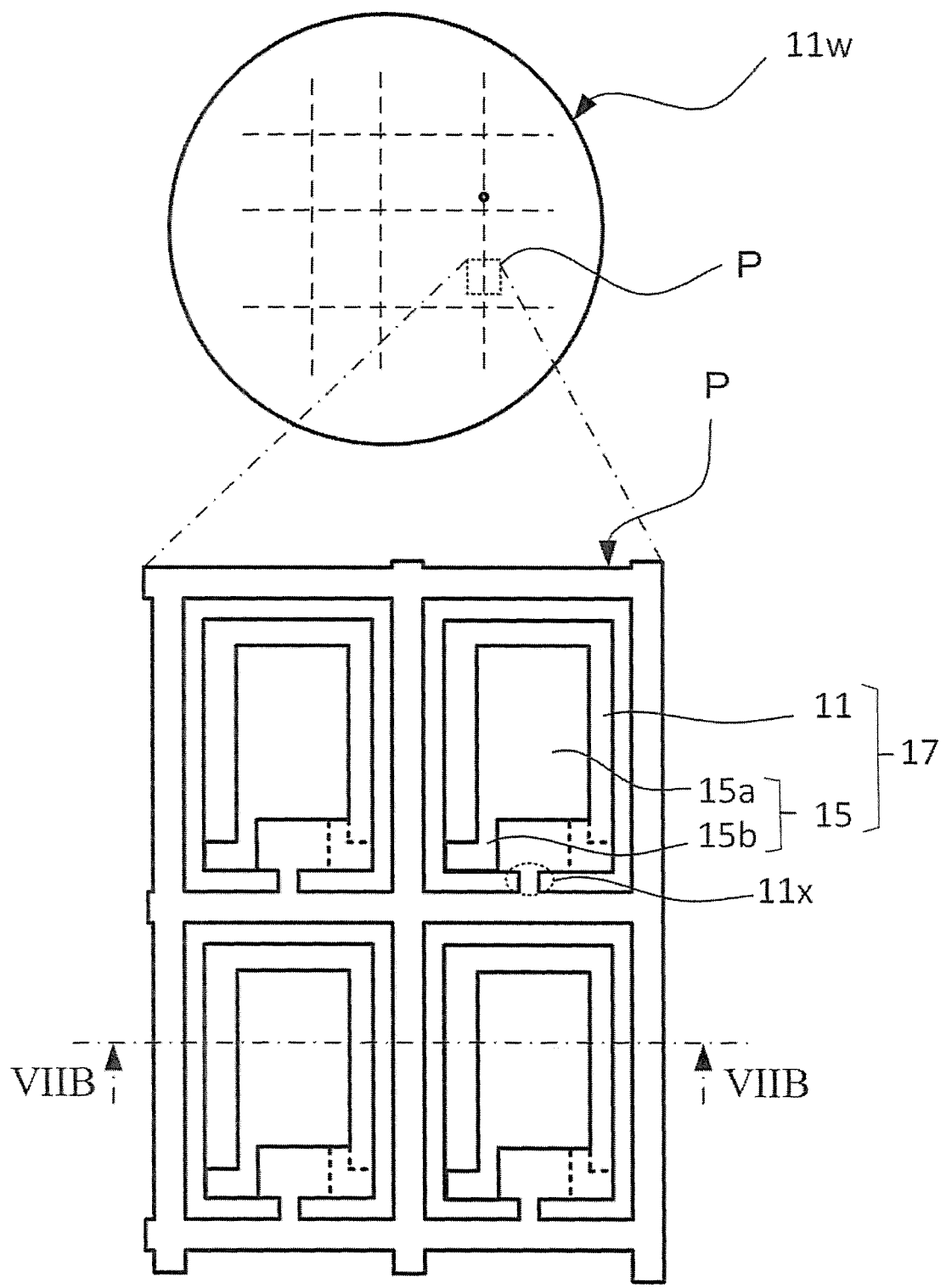
FIG. 7A, FIG. 7B, and FIG. 7C are explanatory drawings illustrating the exemplary manufacturing method following FIG. 6.
Figure 7B:
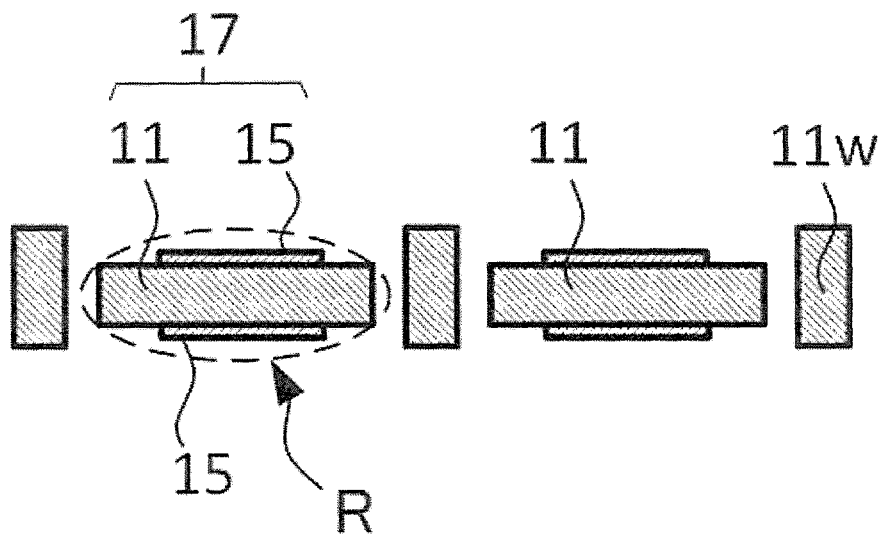
Figure 7C:
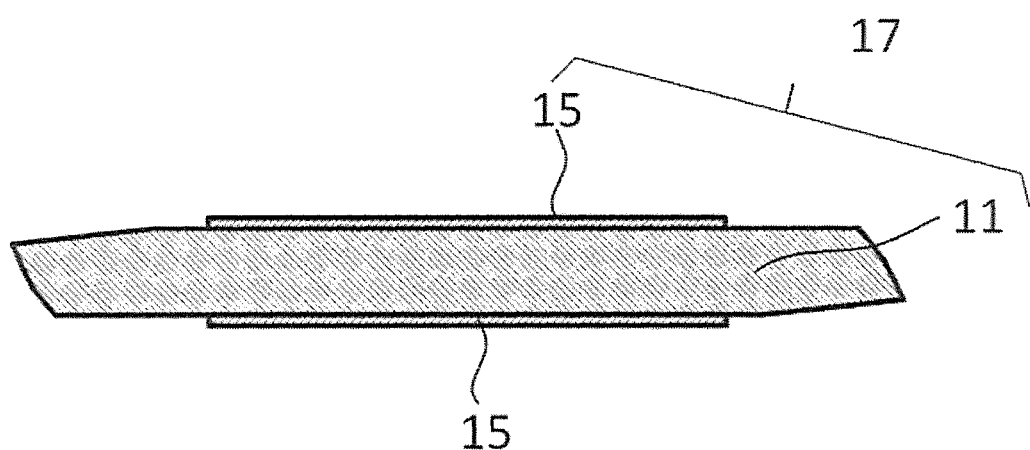
Figure 8A:
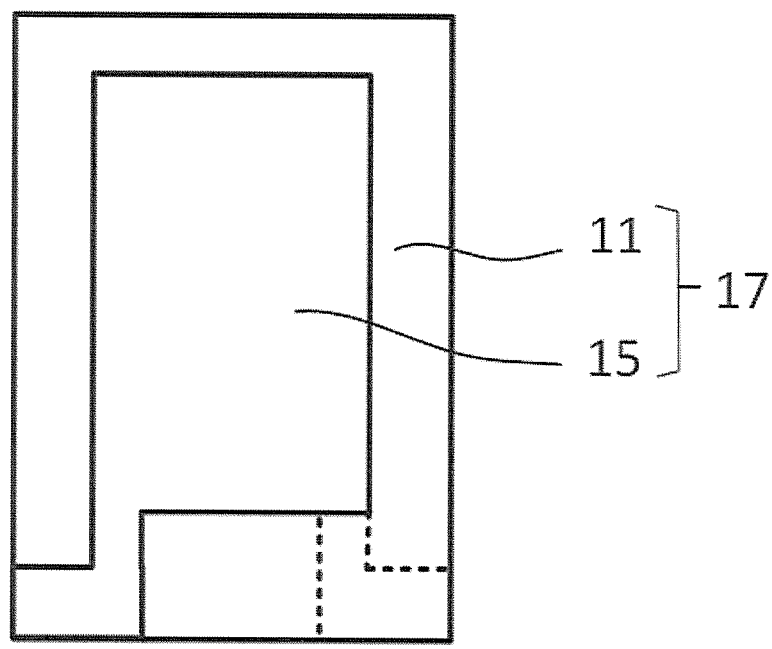
FIG. 8A, FIG. 8B, FIG. 8C, FIG. 8D, and FIG. 8E are explanatory drawings illustrating an exemplary crystal resonator on which the crystal element 11 is mounted to be manufactured.
Figures 8B, 8C:
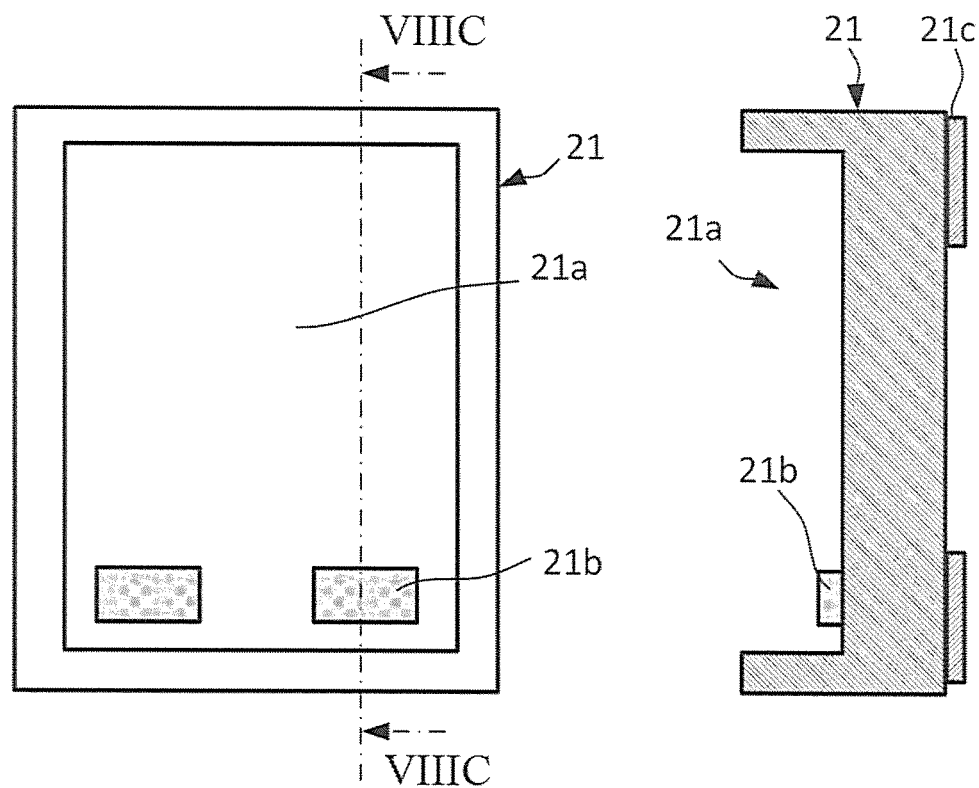
Figure 8D:
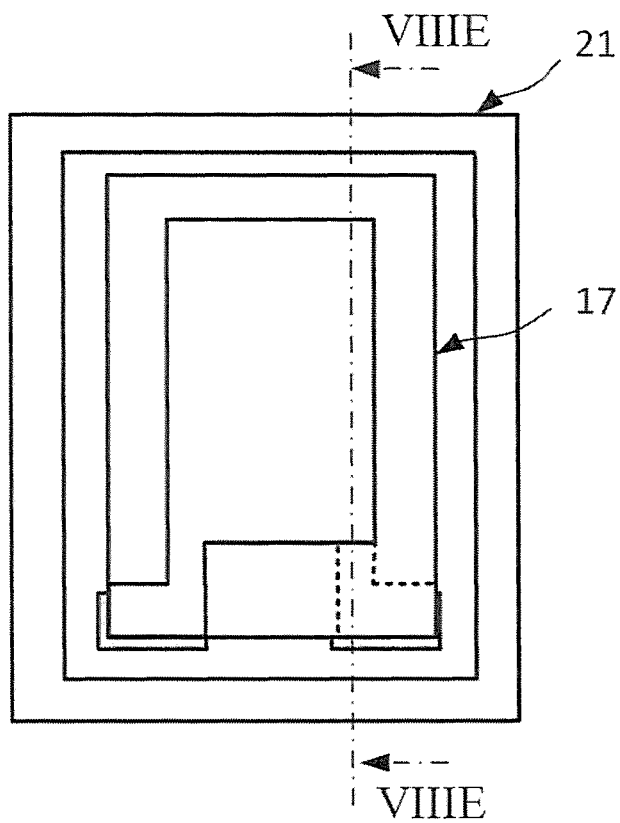
Figure 8E:
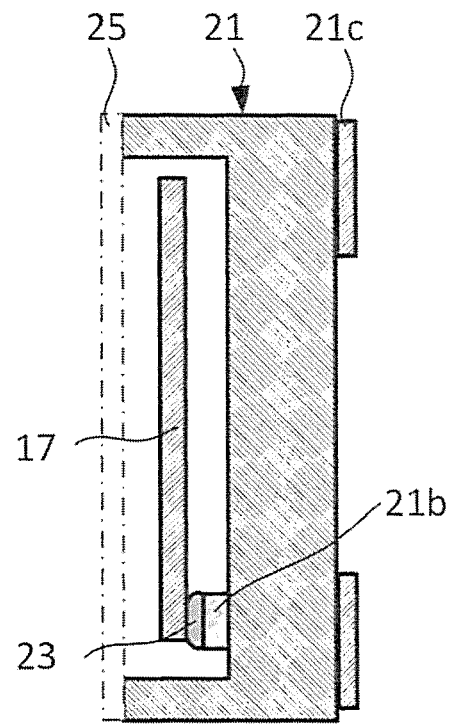

In a state illustrated in FIG. 7A, the crystal resonator 17 is connected to the quartz-crystal wafer 11w via a connecting portion 11x. Therefore, firstly, an appropriate external force is applied to the connecting portion 11x to separate the crystal resonator 17 from the quartz-crystal wafer 11w and individually dice the crystal resonator 17 (see FIG. 8A). On the other hand, as a container, for example, a well-known ceramic package 21 is prepared. In this case, the ceramic package 21 includes a depressed portion 21a, a bump 21b, and a mounting terminal 21c. The depressed portion 21a houses the crystal resonator 17 (see FIG. 8B, FIG. 8C). The bump 21b is disposed on the bottom face of the depressed portion 21a to secure the crystal resonator. The mounting terminal 21c is disposed on the back surface of the package 21. The bump 21b is electrically connected to the mounting terminal 21c by a via wiring (not illustrated).

The crystal resonator 17 is mounted in the depressed portion 21a of the package 21. In detail, a conductive adhesive material 23 is applied over the bump 21b (see FIG. 8E) to fix the crystal resonator 17 on the bump 21b at the position of the extraction electrode 15b. Then, a well-known method is used to adjust the oscillation frequency of the crystal element 11 to a predetermined value. Next, after the inside of the depressed portion 21a of the package 21 is made in an appropriate vacuum atmosphere, an inert gas atmosphere, or similar atmosphere, a well-known method is used to seal the depressed portion 21a with a lid 25. This provides the crystal unit with a structure where the crystal resonator is housed in the package 21.

[3. Experimental Result]

Next, experimental results will be described with reference to FIG. 9 and FIG. 10. FIG. 9 is an explanatory drawing illustrating how impedances of the crystal resonator 17 configured of the crystal element are different depending on the difference of the shape of the Z'-surface of the crystal element. FIG. 9 indicates sample numbers of the crystal elements used in the experiment and features of the shape of the Z'-surface of each sample on the horizontal axis, and indicates the impedance on the vertical axis. The oscillation frequency of the experimental sample is approximately 38 MHz. The detail of the frequency and the impedance is indicated in Table 1.

TABLE 1

| SAMPLE NUMBER | OSCILLATION FREQUENCY (MHz) | IMPEDANCE (Ω) | REMARKS |
| --- | --- | --- | --- |
| 1 | 38.54349677 | 260.49 | SAMPLE WHERE PROTRUSIONS ARE LEFT |
| 2 | 38.54670424 | 205.78 | SAMPLE WHERE PROTRUSIONS ARE LEFT |
| 3 | 38.55282675 | 421.39 | SAMPLE WHERE PROTRUSIONS ARE LEFT |
| 4 | 38.63510545 | 151.79 | SAMPLE WHERE PROTRUSIONS ARE LEFT |
| 5 | 38.64255206 | 201.31 | SAMPLE WHERE FOURTH SURFACE IS GENERATED |
| 6 | 38.66838059 | 584.4 | SAMPLE WHERE FOURTH SURFACE IS GENERATED |
| 7 | 38.70607843 | 230.85 | SAMPLE WHERE FOURTH SURFACE IS GENERATED |
| 8 | 38.66896606 | 79.969 | SAMPLE OF THIS DISCLOSURE |
| 9 | 38.69384575 | 73.843 | SAMPLE OF THIS DISCLOSURE |

As illustrated in FIG. 9, the impedance of a sample that has protrusions left on the Z'-surface of the crystal element is approximately 150Ω to 400Ω. The impedance of a sample in which the Z'-surface of the crystal element is configured of four surfaces of the first surface to the fourth surface is approximately 200Ω to 600Ω. On the contrary, the impedance of a sample within the region of the embodiment in which the Z'-surface of the crystal element is configured of the three surfaces of the first surface to the third surface, and the angles θ1 to θ3 of each surface with respect to the AT-cut principal surface (see FIG. 1 A to FIG. 1C) are the predetermined angles is approximately 80Ω. This indicates that the impedance is reduced to the value equal to or less than half compared with former two samples.

Figure 10:
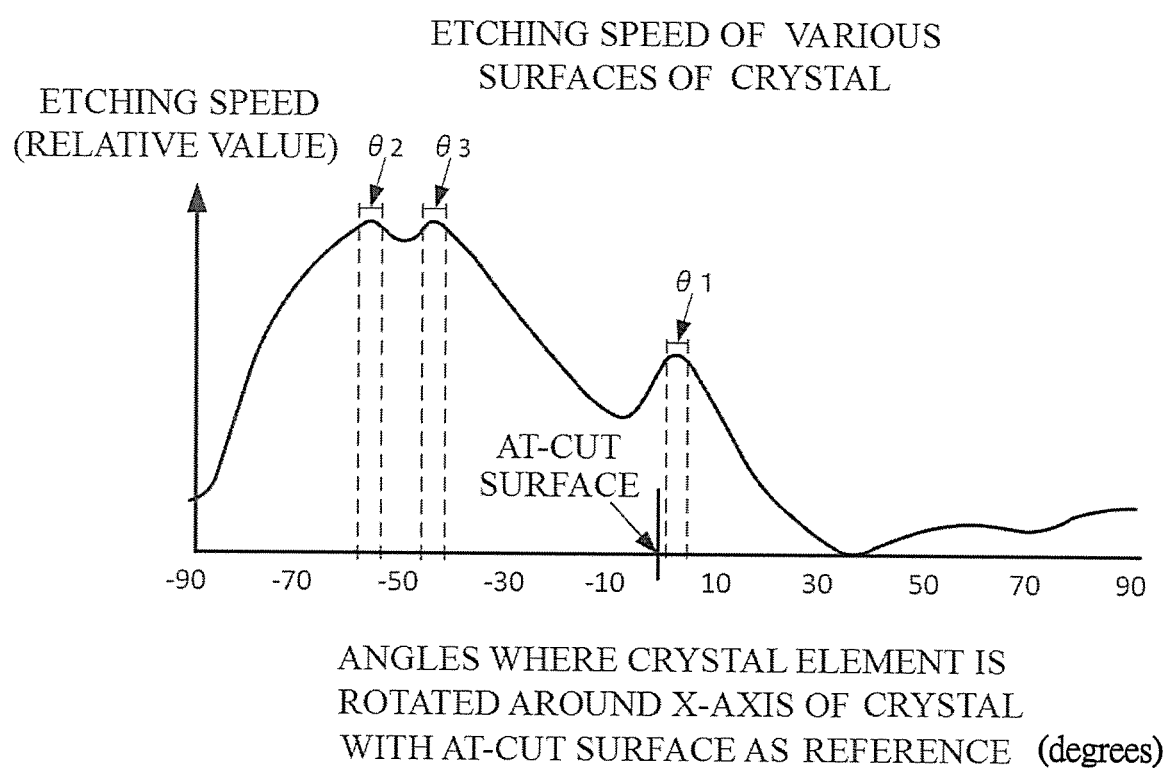
FIG. 10 is an explanatory drawing illustrating the experimental result according to this disclosure following FIG. 10.

FIG. 10 is an explanatory drawing illustrating the first surface 11a, the second surface 11b, and the third surface 11c according to the embodiment. Specifically, FIG. 10 indicates the experimental result by the inventors according to this application, and indicates the difference of the etching speed of various crystal surfaces of the crystal to a hydrogen fluoride-based etchant. More specifically, FIG. 10 indicates the angles where the AT-cut principal surface as a reference is rotated around the X-axis of the crystal on the horizontal axis, and indicates the etching speed of each crystal surface that is obtained by rotating an AT-cut surface as described above on the vertical axis. The etching speed of each surface is indicated by the relative value as a reference etching speed of the AT-cut surface.

As illustrated in FIG. 10, the crystal has the maximum etching speed on each surface of a surface corresponding to a surface where the AT-cut principal surface is rotated by θ1, a surface corresponding to a surface where the AT-cut principal surface is rotated by θ2, and a surface corresponding to a surface where the AT-cut principal surface is rotated by θ3. Then, θ1 is approximately 4°, θ2 is approximately −57°, and θ3 is approximately −42°. Furthermore, the experiment by the inventor found that, in the region where the impedance is proper, as described with reference to FIG. 9, the angles are as follows: θ1=4°±3.5°, θ2=−57°±5°, and θ3=−42°±5°, and more preferably, θ1=4°±3°, θ2=−57°±3°, and θ3=−42°±3°. Each surface specified by these θ1 to θ3 corresponds to the first to the third surfaces according to the embodiment.

[4. Other Embodiments]

While the embodiment of the AT-cut crystal element and the crystal resonator that employs the AT-cut crystal element according to this disclosure is described above, this disclosure is not limited to the above-described embodiment. For example, in the above-described embodiment, while the configuration where the side surfaces of both ends in the Z' direction are constituted of the three surfaces of the first to the third surfaces according to the embodiment is described, in other embodiments, only one side surface may be constituted of the three surfaces of the first to the third surfaces. However, the configuration where both the side surfaces are constituted of the three surfaces of the first to the third surface provides the crystal resonator with more excellent property. While in the above-described embodiment, the crystal resonator with the frequency of approximately 38 MHz is employed, this disclosure is applicable to the crystal resonator with the other frequency.

Figure 5C:
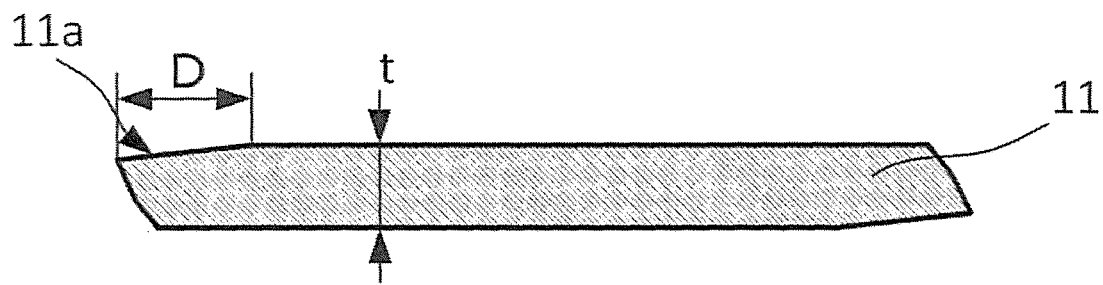

In the above-described exemplary manufacturing method, the parts of the etching resist masks 13 (see FIG. 2A and FIG. 2B) corresponding to the outer shape of the crystal element are formed so as to oppose one another on the front and back of the quartz-crystal wafer. However, the parts of the etching resist mask corresponding to the outer shape of the crystal element may be displaced by ΔZ along the Z' direction between the front and the back of the quartz-crystal wafer. The front and back masks are relatively displaced such that the etching resist mask disposed on a +Y' surface side of the crystal element displaces by ΔZ with respect to the etching resist mask disposed on a −Y' surface side in a +Z' direction. Thus, in the case where the mask displacement is performed, the Z'-surface of the crystal element can be formed in the shape constituted of the three surfaces of the first to the third surfaces in a short etching period compared with a case where the mask displacement is not performed. There is also an advantage that a length D (see FIG. 5C) of the first surface 11a in the Z' direction can be controlled by this displacement amount.

Figure 11A:
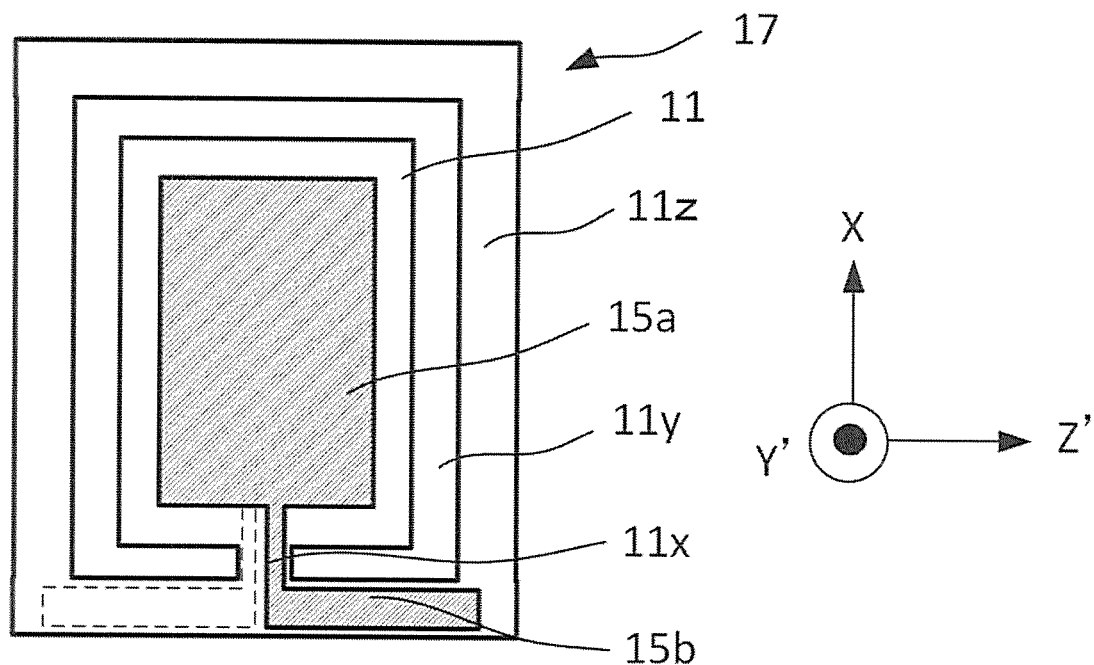
FIG. 11A and FIG. 11B are explanatory drawings illustrating another embodiment of the crystal resonator according to this disclosure.
Figure 11B:
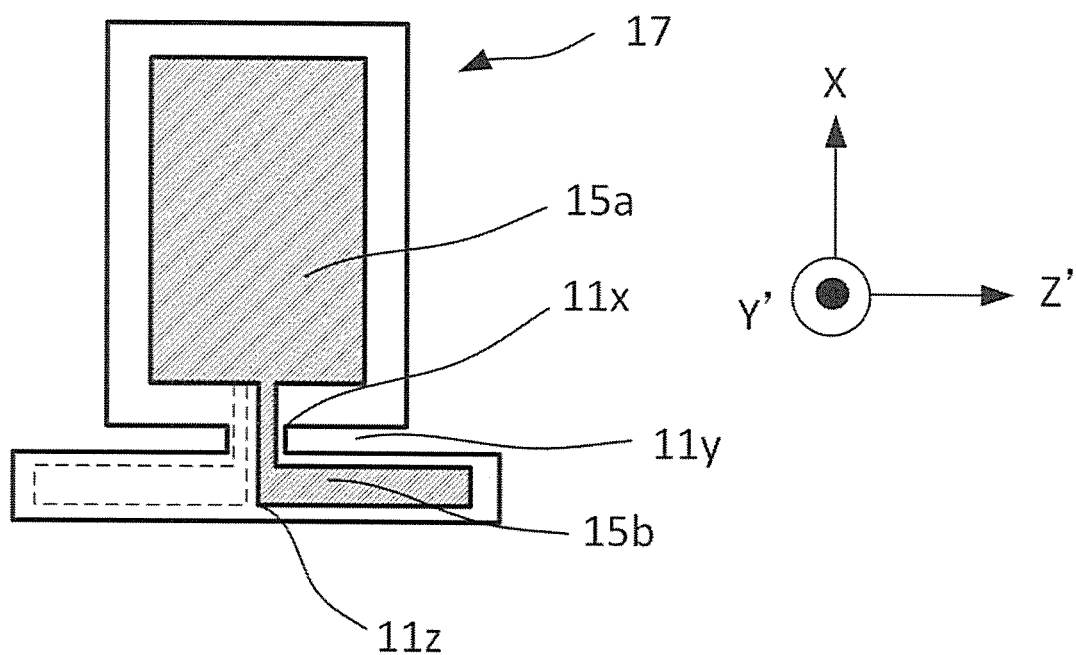

The AT-cut crystal element and the crystal resonator according to this disclosure may have the structure illustrated in FIG. 11A and FIG. 11B. Firstly, as illustrated in FIG. 11A, the crystal element and the crystal resonator include the crystal element 11 according to the disclosure, a framing portion 11z, and one connecting portion 11x. The framing portion 11z is integrally formed with the crystal element 11 and boxes the crystal element 11 with the entire framing portion 11z separated by a through portion 11y. The connecting portion 11x is also integrally formed with the crystal element 11, and connects the crystal element 11 to the framing portion 11z. As illustrated in FIG. 11B, the crystal element and the crystal resonator include the crystal element 11 according to the disclosure, the framing portion 11z, and one connecting portion 11x. The framing portion 11z is integrally formed with the crystal element 11 and boxes the crystal element 11 with a part of the framing portion 11z separated by the through portion 11y. The connecting portion 11x is also integrally formed with the crystal element 11, and connects the crystal element 11 to the framing portion 11z. The connecting portion may be disposed two or more. However, the configuration of one connecting portion reduces vibration leakage from the crystal element 11 to the framing portion and the influence of the stress from the framing portion to the crystal element more easily. The position where the connecting portion 11x is disposed is not limited to the example in FIG. 11A and FIG. 11B. The position may be changed corresponding to the design.

While in the above-described embodiment, the crystal element that has a side along the X-axis of the crystal as a long side, and a side along the Z'-axis as a short side is employed, this disclosure is applicable to a crystal element that has a side along the X-axis of the crystal as a short side, and a side along the Z'-axis as a long side. While in in the above-described embodiment, the crystal element that has a planar shape in a rectangular shape, this disclosure is applicable to a crystal element that has corner portions to which an "R processing" or a "C processing" is performed.

The first surface is preferably a surface corresponding to a surface where a principal surface of the AT-cut crystal element is rotated around an X-axis of crystal by 4°±3.5°. Here, the principal surface is an X-Z' surface of the AT-cut crystal element represented by crystallographic axes of the crystal (the same applies hereinafter).

The first surface, the second surface, and the third surface intersect in this order, and preferably, the first surface is a surface corresponding to a surface where the principal surface is rotated around the X-axis of the crystal by 4°±3.5°, the second surface is a surface corresponding to a surface where the principal surface is rotated around the X-axis of the crystal by −57°±5°, and the third surface is a surface corresponding to a surface where the principal surface is rotated around the X-axis of the crystal by −42°±5°. Here, "−" of −57° and −42° means that the principal surface is rotated around the X-axis in a clockwise direction (the same applies hereinafter).

More preferably, the first surface, the second surface, and the third surface intersect in this order, and the first surface is a surface corresponding to a surface where the principal surface is rotated around the X-axis of the crystal by 4°±3°, the second surface is a surface corresponding to a surface where the principal surface is rotated around the X-axis of the crystal by −57°±3°, and the third surface is a surface corresponding to a surface where the principal surface is rotated around the X-axis of the crystal by −42°±3°.

Both of two side surfaces of the AT-cut crystal element that intersect with a Z'-axis of crystallographic axes of crystal are preferably constituted of the three surfaces of the first surface to the third surface. More preferably, the two side surfaces are disposed in a point symmetry one another with a center point of the AT-cut crystal element as a center (see FIG. 1B).

A crystal resonator according to the disclosure includes the above-described AT-cut crystal element according to the disclosure, and excitation electrodes to excite the crystal element. More specifically, the crystal resonator includes the excitation electrodes on each of front and back principal surfaces (above-described X-Z' surface) of the crystal element, and includes extraction electrodes extracted from the excitation electrodes. Of course, the crystal resonator according to the disclosure includes a crystal resonator that further includes a container to house the crystal resonator with the electrodes.

The AT-cut crystal element according to the disclosure includes a crystal element (hereinafter, referred to as a framed crystal element) that includes the above-described crystal element according to the disclosure, a framing portion, and one, or two or more connecting portions. The framing portion is integrally formed with the crystal element, and boxes the crystal element with the entire or a part of the framing portion separated by a through portion. The connecting portion is also integrally formed with the crystal element, and connects the crystal element to the framing portion (see FIG. 11A, FIG. 11B). The crystal resonator according to the disclosure includes a crystal resonator that includes the above-described framed crystal element, the excitation electrodes, and the extraction electrodes, and further includes a crystal resonator that includes a container to house the crystal resonator.

With the AT-cut crystal element according to the embodiment, the AT-cut crystal element includes a Z' side surface that is constituted of predetermined three surfaces. This achieves a crystal element that has a unique beak-shaped structure in a cross-sectional view on the end portion of the crystal element in a Z' direction. The above-described unique structure attenuates unnecessary vibrations other than vibrations original to the AT-cut to dominantly generate the vibration original to the AT-cut crystal resonator. Therefore, the AT-cut crystal resonator with the improved property compared with conventional AT-cut crystal resonators is achieved.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. An AT-cut crystal element, comprising:
side surfaces intersecting with a Z'-axis of a crystallographic axis of a crystal, and
at least one side surface of the side surfaces being constituted of three surfaces of a first surface, a second surface and a third surface,
wherein
the first surface, the second surface, and the third surface intersect in this order, and
the first surface is a surface corresponding to a surface where a principal surface is rotated around an X-axis of the crystal by $4°±3.5°$, wherein the principal surface is an X-Z' surface of the AT-cut crystal element and the X-Z' surface is represented by the crystallographic axes of the crystal,
the second surface is a surface corresponding to a surface where the principal surface is rotated around the X-axis of the crystal by $-57°±5°$, and
the third surface is a surface corresponding to a surface where the principal surface is rotated around the X-axis of the crystal by $-42°±5°$.

2. The AT-cut crystal element according to claim 1, wherein
the first surface is the surface corresponding to the surface where the principal surface is rotated around the X-axis of the crystal by $4°±3°$,
the second surface is the surface corresponding to the surface where the principal surface is rotated around the X-axis of the crystal by $-57°±3°$, and
the third surface is the surface corresponding to the surface where the principal surface is rotated around the X-axis of the crystal by $-42°±3°$.

3. The AT-cut crystal element according to claim 1, wherein
the AT-cut crystal element has a planar shape in a rectangular shape, and one side of the planar shape is disposed along the Z'-axis.

4. The AT-cut crystal element according to claim 1, wherein
each side surface of both of the side surfaces is constituted of the three surfaces of the first surface, the second surface and the third surface.

5. The AT-cut crystal element according to claim 1, wherein
both the side surfaces are disposed in a point symmetry one another with a center point of the AT-cut crystal element as a center.

6. A crystal resonator, comprising:
the AT-cut crystal element according to claim 1;
excitation electrodes disposed on front and back of the AT-cut crystal element; and
extraction electrodes extracted from the excitation electrodes.

7. A crystal unit, comprising:
the crystal resonator according to claim 6; and
a container housing the crystal resonator.

* * * * *